(12) United States Patent
Asami

(10) Patent No.: US 7,197,413 B2
(45) Date of Patent: Mar. 27, 2007

(54) DELAY AMOUNT MEASUREMENT METHOD

(75) Inventor: Koji Asami, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/251,600

(22) Filed: Oct. 14, 2005

(65) Prior Publication Data

US 2006/0161383 A1    Jul. 20, 2006

Related U.S. Application Data

(63) Continuation of application No. PCT/JP05/11439, filed on Jun. 22, 2005.

(30) Foreign Application Priority Data

Jul. 12, 2004 (JP) .............................. 2004-205178

(51) Int. Cl.
*G01R 29/04* (2006.01)
*G04F 1/00* (2006.01)

(52) U.S. Cl. ........................... 702/79; 702/89; 702/176

(58) Field of Classification Search .................. 702/79, 702/89, 85, 176–178; 324/76.35, 76.54, 324/617

See application file for complete search history.

(56) References Cited

OTHER PUBLICATIONS

Kijima et al. , "HMD with time delay compensation capability", Proceedings of International Symposium on Mixed Reality 2001 (Mar. 14-15, 2001, Yokohama Japan).*

* cited by examiner

*Primary Examiner*—Bryan Bui
*Assistant Examiner*—John Le
(74) *Attorney, Agent, or Firm*—Osha•Liang LLP

(57) ABSTRACT

There is provided a delay amount measuring method of measuring a delay amount in an electronic device that outputs an output signal according to an input signal. The method includes a conversion step of converting the input signal and the output signal into digital data, a shift step of sequentially shifting the digital data of either of the input signal or the output signal in a time direction, an error computing step of computing a squared error of the digital data of the input signal and the digital data of the output signal with respect to each shift amount in the shift step, and a delay amount computing step of computing the shift amount when the squared error is a minimum value by means of a nonlinear least squares method and using the computed shift amount as the delay amount in the electronic device.

4 Claims, 6 Drawing Sheets

DELAY AMOUNT MEASUREMENT METHOD

CROSS REFERENCE TO THE RELATED APPLICATION

The present application is a continuation application of PCT/JP2005/011439 filed on Jun. 22, 2005, which claims priority from a Japanese Patent application No. 2004-205178 filed on Jul. 12, 2004, the entire contents of which are incorporated herein by reference.

BACKGROUND OF THE INVENTION

1. Field of the Invention

The present invention relates to a delay amount measuring method of measuring a delay amount in an electronic device that outputs an output signal according to an input signal.

2. Description of Related Art

Conventionally, when measuring a nonlinear characteristic of input and output signals of an electronic device such as an amplifier, the nonlinear characteristic is computed from an amplitude ratio and a phase difference of an input waveform and an output waveform. When such a nonlinear characteristic is computed, it is necessary to accurately match the comparison points of the input waveform and the output waveform. For this reason, it is necessary to accurately measure delay time in an amplifier or the like.

For example, there has been known a method of measuring delay time by means of a cross-correlation function of an input waveform and an output waveform. This method computes a cross-correlation function by performing Fourier transform on the input waveform and the output waveform respectively. Then, a phase characteristic of the cross-correlation function is unwrapped to obtain a characteristic of a straight line, and the delay time is computed from an inclination of the characteristic.

Now, since a related patent document is not recognized, the description is omitted.

However, since a cross-correlation function cannot be computed accurately when nonlinearity in characteristics of an amplifier or the like is strong, delay time in an amplifier or the like cannot be computed with high precision. Moreover, since a phase characteristic of the cross-correlation function is discontinuous even in case of unwrapping the phase characteristic when an input waveform is a discontinuous waveform in a frequency-axis direction, e.g., like a multi-tone signal, delay time in an amplifier or the like cannot be computed with high precision.

When nonlinearity of an amplifier or the like is strong, delay time can accurately be obtained to some extent by obtaining the delay time repeatedly while correcting the nonlinearity. However, there has been a problem that operation time increases extremely and thus measurement efficiency is low. Moreover, since the operation of the phase characteristic is easy to be influenced by a noise or the like, an error may be observed significantly.

SUMMARY OF THE INVENTION

Therefore, it is an object of the present invention to provide a delay amount measuring method that can solve the foregoing problems. The above and other objects can be achieved by combinations described in the independent claims. The dependent claims define further advantageous and exemplary combinations of the present invention.

To solve this problem, according to the present invention, there is provided a delay amount measuring method of measuring a delay amount in an electronic device that outputs an output signal according to an input signal. The method includes a conversion step of converting the input signal and the output signal into digital data, a shift step of sequentially shifting the digital data of either of the input signal or the output signal in a time direction, an error computing step of computing a squared error of the digital data of the input signal and the digital data of the output signal with respect to each shift amount in the shift step, and a delay amount computing step of computing the shift amount when the squared error is a minimum value by means of a nonlinear least squares method and using the computed shift amount as the delay amount in the electronic device.

The summary of the invention does not necessarily describe all necessary features of the present invention. The present invention may also be a sub-combination of the features described above.

According to the present invention, although an output signal has a distortion due to nonlinearity of an electronic device, it is possible to compute a delay amount in the electronic device with high precision without relying on a waveform of the output signal.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
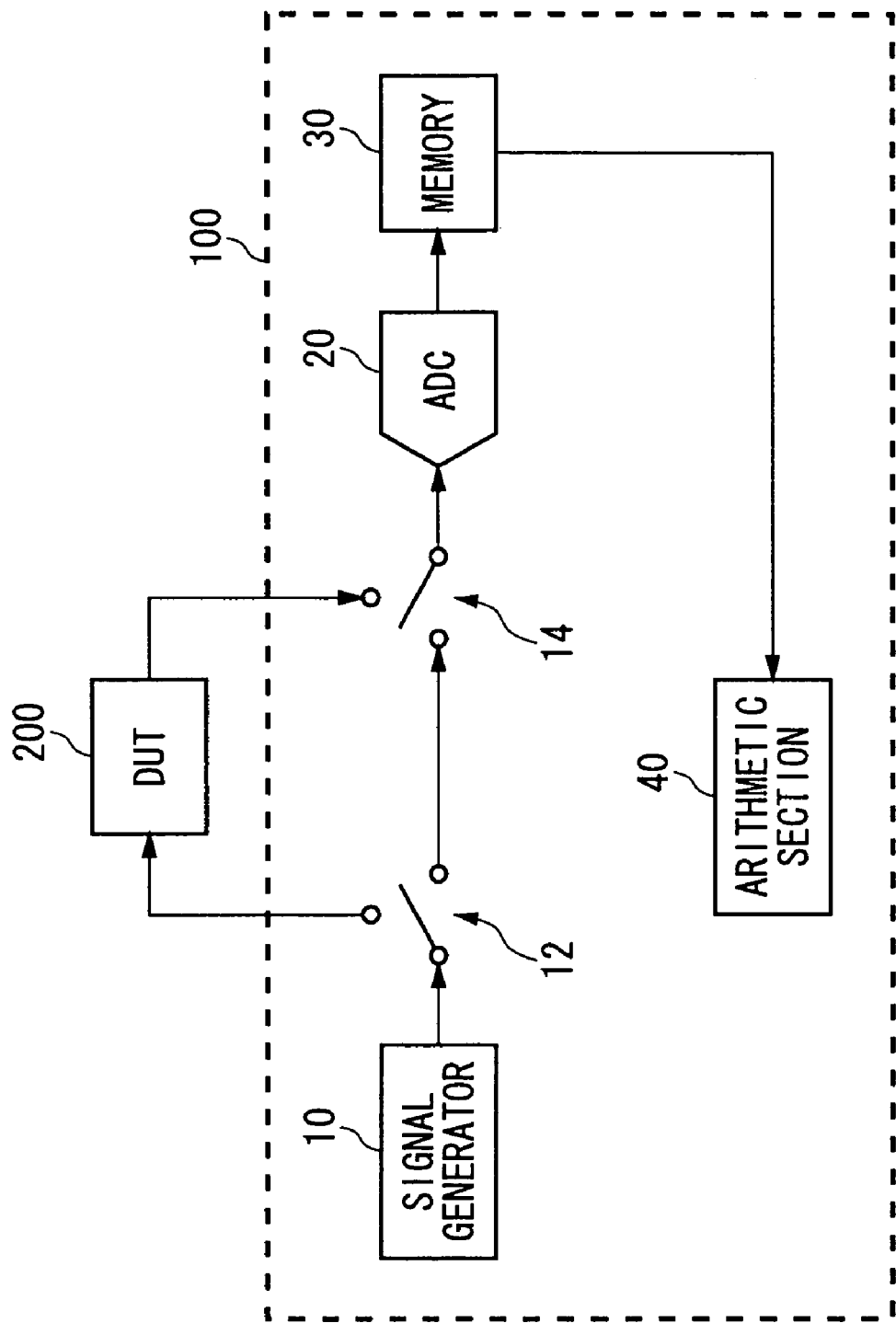
FIG. 1 is a view exemplary showing a configuration of a measuring apparatus 100 according to an embodiment of the present invention.

FIG. 1 is a view exemplary showing a configuration of a measuring apparatus 100 according to an embodiment of the present invention. The measuring apparatus 100 is an apparatus for measuring a nonlinear characteristic of an electronic device 200 such as an amplifier, and includes a signal generator 10, switches 12 and 14, an analog-digital converter 20 (hereinafter, referred to as an ADC 20), a memory 30, and an arithmetic section 40.

The measuring apparatus 100 stores an input signal to be input into the electronic device 200 and an output signal output from the electronic device 200 on the memory 30 in order to measure a nonlinear characteristic of the electronic device 200.

The signal generator 10 generates the input signal to be input into the electronic device 200. The switch 12 selects which one of the electronic device 200 and the ADC 20 is connected to the signal generator 10. When the input signal is stored on the memory 30, the switch 12 connects the ADC 20 to the signal generator 10. Moreover, when the output signal is stored on the memory 30, the switch 12 connects the electronic device 200 to the signal generator 10 and inputs the input signal into the electronic device 200.

The ADC 20 converts a given analog signal into a digital signal. The switch 14 selects which one of the electronic device 200 and the signal generator 10 is connected to the ADC 20. When the input signal is stored on the memory 30, the switch 14 connects the signal generator 10 to the ADC 20 and stores the input signal on the memory 30 via the ADC 20. Moreover, when the output signal is stored on the memory 30, the switch 14 connects the electronic device 200 to the ADC 20 and stores the output signal on the memory 30 via the ADC 20.

The arithmetic section 40 computes delay time of a signal in the electronic device 200 based on the input signal and the output signal stored on the memory 30, corrects the phase difference between the input signal and the output signal based on the delay time, and computes a nonlinear characteristic of the electronic device 200 based on the input signal and the output signal having the corrected phase difference. Next, it will be described about a method of measuring delay time in the electronic device 200 based on the input signal and the output signal.

Figure 2:
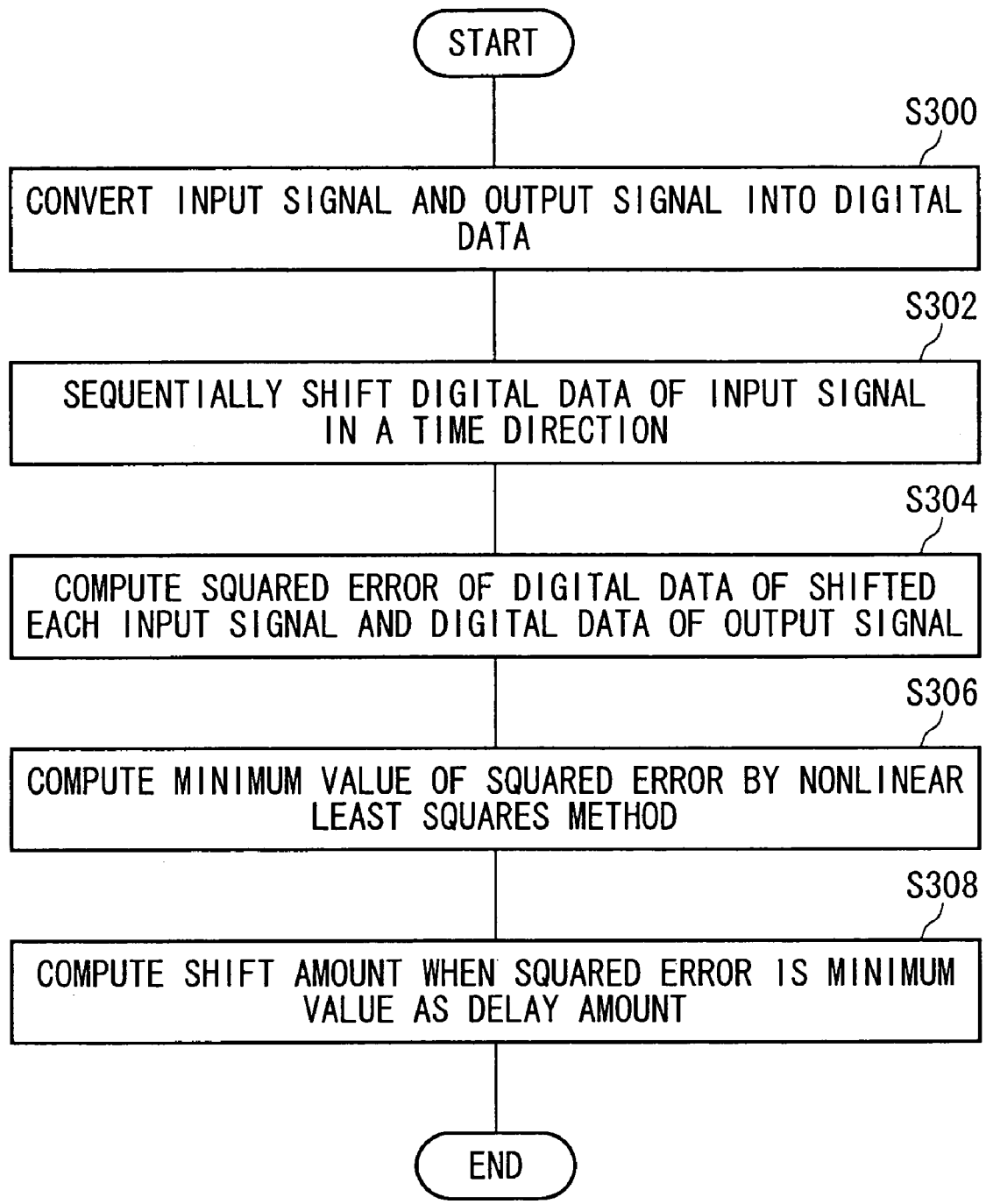
FIG. 2 is a flowchart exemplary showing a delay amount measuring method of measuring a delay amount in an electronic device 200.

FIG. 2 is a flowchart exemplary showing a delay amount measuring method of measuring a delay amount in the electronic device 200. At first, the ADC 20 converts an input signal and an output signal into and from the electronic device 200 into digital data, and stores them on the memory 30 (S300).

Next, the digital data of the output signal is sequentially shifted in a time direction (S302). In place of the output signal, the digital data of the input signal may sequentially be shifted in a time direction. At this time, a shift amount by which the digital data is sequentially shifted is predetermined according to a precision of delay time to be measured.

Next, a squared error of each of the digital data of the input signal and the digital data of the output signal that have been shifted is computed for each of the shift amounts by which the digital data are sequentially shifted in S302 (S304). Here, in the following expression, there is provided a squared error Err [τ] of the input signal and the output signal when the output signal has been phase-shifted by a shift amount τ.

$$Err[\tau] = \frac{1}{N}\sum_{k=1}^{N}(Meas(k, \tau) - Ref(k))^2 \quad \text{[Expression 1]}$$

Here, Meas(k, τ) shows k-th data of the digital data of the output signal when the output signal has been phase-shifted by τ, Ref(k) shows k-th data of the digital data of the input signal, and N shows the number of data of the input signal and the output signal.

Here, the shift amount τ of the output signal may be an integral multiple of a sampling period of the ADC 20. For example, when the shift amount τ is same as the sampling period of the ADC 20, the arithmetic section 40 can easily obtain shift data by shifting the digital data of the output signal one-by-one in a time direction.

Moreover, when the shift amount τ of the output signal is smaller than the sampling period of the ADC 20, the arithmetic section 40 may compute the shift data by performing discrete Fourier transform on the digital data of the output signal to convert the date into a complex signal in a frequency domain, shifting a phase of the complex signal in the frequency domain according to the shift amount τ, and performing reverse discrete Fourier transform on the complex signal in the frequency domain of which the phase has been shifted to convert it into a signal in a time domain.

Next, a minimum value of the squared error is computed by approximating the squared error computed for each shift amount τ by means of a nonlinear least squares method (S306). Then, the shift amount τ, at which the squared error becomes the minimum value, is computed as a phase difference between the input signal and the output signal, i.e., a delay amount in the electronic device 200 (S308).

By such an operation, a delay amount in the electronic device 200 can be computed. Moreover, according to the delay amount measuring method in this example, although a distortion occurs in the output signal due to nonlinearity of the electronic device 200, it is possible to compute a delay amount with high precision without relying on a waveform of the output signal.

Figure 3:
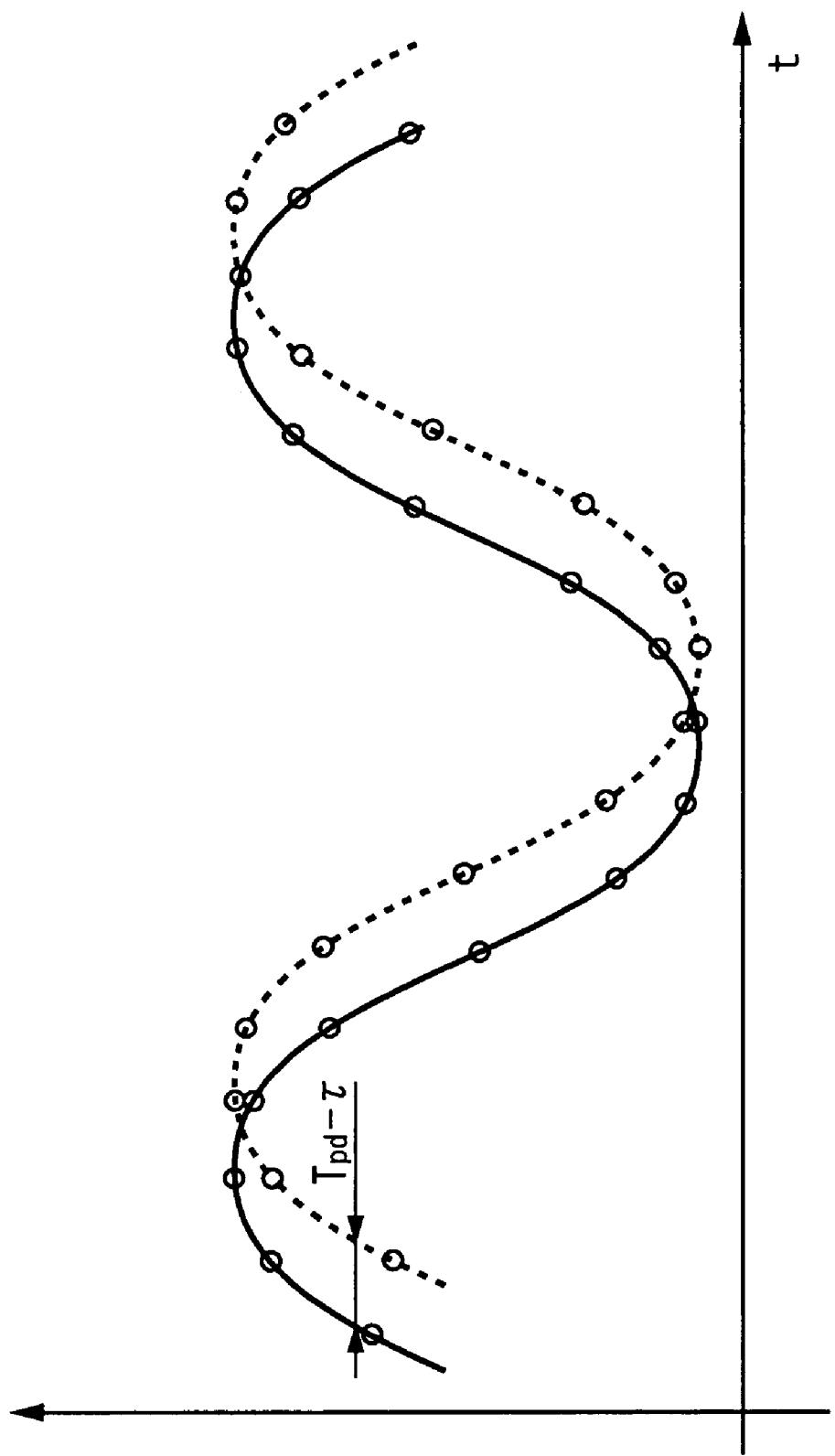
FIG. 3 is a view exemplary showing waveforms of an input signal and an output signal.

FIG. 3 is a view exemplary showing waveforms of an input signal and an output signal. In FIG. 3, the input signal is shown by a waveform of a solid line and the output signal is shown by a waveform of a wavy line. When shifting the output signal by the shift amount τ, a phase difference between the input signal and the output signal is given as Tpd–τ when a delay amount in the electronic device 200 is Tpd.

As described in FIG. 2, the arithmetic section 40 shifts a phase of the output signal by the shift amount τ, and computes a total sum of a squared error of the input signal data and the output signal data at each sampling point. Then, the shift amount τ at which the squared error becomes a minimum value is obtained by fluctuating the shift amount τ. Since the τ at which the squared error becomes a minimum value is obtained when Tpd=τ, it is possible to compute a delay amount in the electronic device 200.

Figure 4:
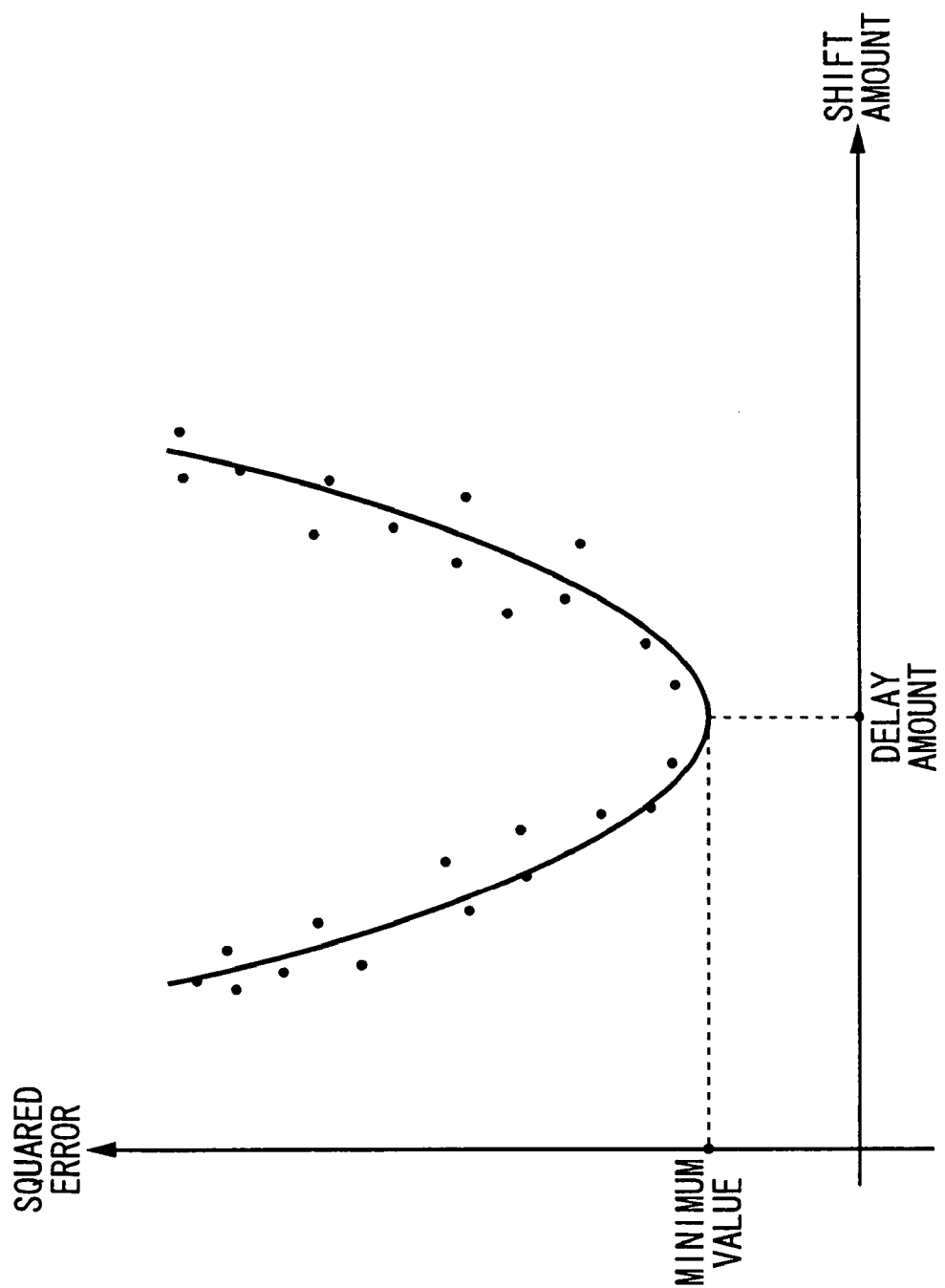
FIG. 4 is a graph showing a squared error that is computed for each shift amount τ.

FIG. 4 is a graph showing a squared error that is computed for each shift amount τ. In FIG. 4, a horizontal axis shows a shift amount τ and a vertical axis shows a squared error. As shown in FIG. 4, a squared error can approximate to a quadratic curve with high precision. It is possible to compute a delay amount in the electronic device 200 with high precision by approximating a squared error to a quadratic curve by means of a nonlinear least squares method, computing a minimum value of the quadratic curve, and obtaining a shift amount at that time.

Figure 5:
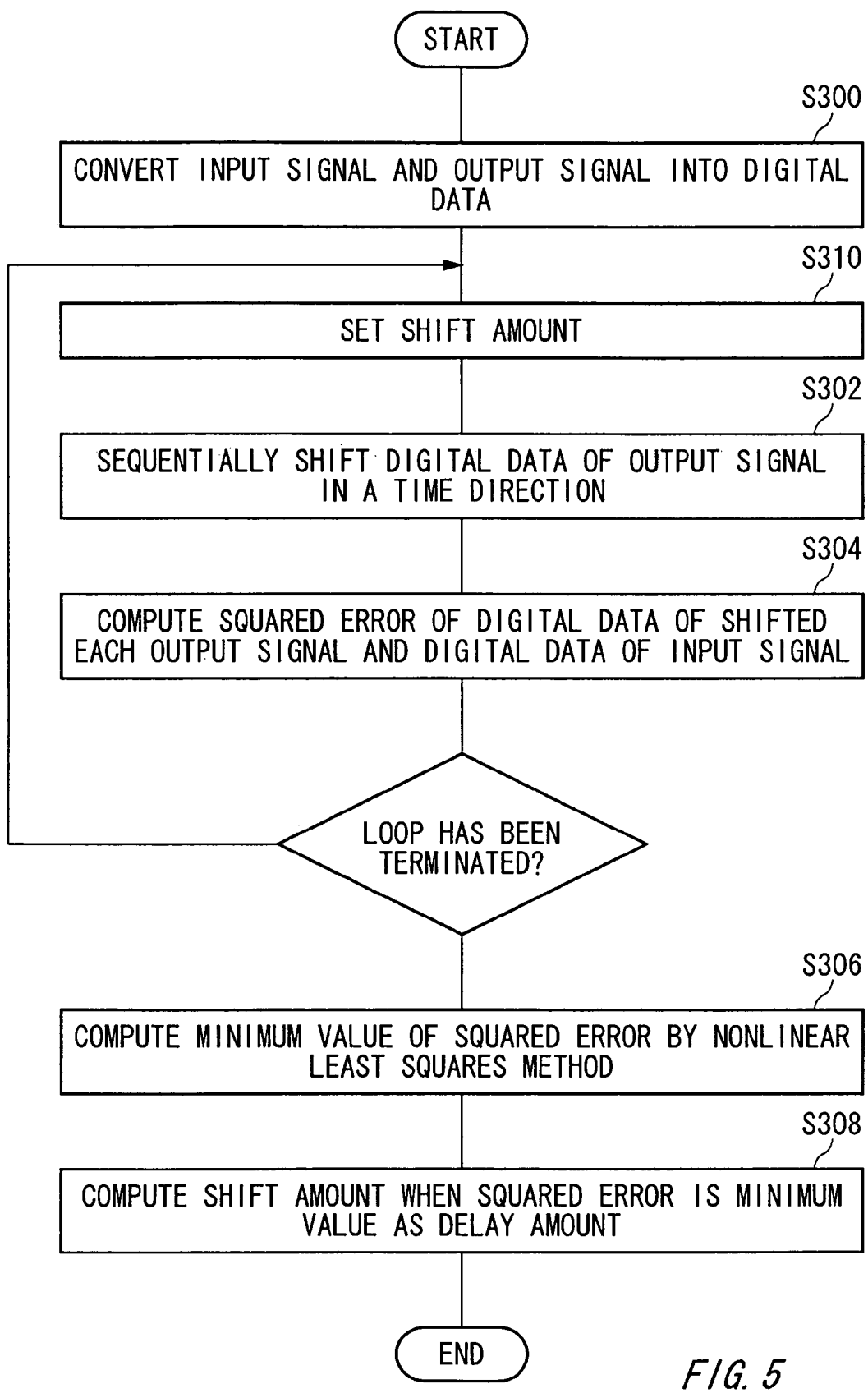
FIG. 5 is a flowchart showing another example of the delay amount measuring method.

FIG. 5 is a flowchart showing another example of the delay amount measuring method. At first, the ADC 20 converts an input signal and an output signal into and from the electronic device 200 into digital data, and stores them on the memory 30 (S300). Next, a shift amount sequentially shifting a phase of the output signal is determined (S310). Then, the digital data of the output signal is sequentially shifted by the shift amount in a time direction (S302). Here, a squared error of the digital data of the input signal and the digital data of the output signal that have respectively been shifted in S302 is computed (S304). Then, a minimum value of the squared error is computed by approximating the squared error computed for each shift amount by means of a nonlinear least squares method (S306). By such an operation, it is possible to compute a phase difference between the input signal and the output signal with resolution of the shift amount set in S310.

The delay amount measuring method in this example repeats the operations from S310 to S306 more than once while keeping the shift amount set in S310 small. In other words, the computation of the phase difference between the input signal and the output signal is performed while keeping the resolution small. For example, in the first operations from S310 to S306, the shift amount set in S310 is computed to be equal to the sampling period of the ADC 20. In the second operations from S310 to S306, the shift amount set in S310 is computed to be ¹/₁₀ of the sampling period of the ADC 20.

At this time, in the second S302, the phase of the output signal is shifted only in the vicinity of the shift amount, which is computed in the first S306, when the squared error is a minimum value. For example, in the second S302, the output signal is shifted by the resolution set in S310 before and behind the shift amount computed in the first S306. The phase difference between the input signal and the output signal is computed with high precision by repeating such an operation more than once. The frequency of loop showing how many times the operations from S310 to S306 is repeated may be predetermined according to the precision of the delay amount to be computed. Then, after performing the operations from S310 to S306 by the frequency of loop, the shift amount computed in the last S306 is computed as a delay amount in the electronic device 200 (S308).

Moreover, in place of the operations in the first from S310 to S306 of computing the phase difference between the input signal and the output signal by means of the resolution of the sampling period of the ADC 20, the phase difference between the input signal and the output signal may be computed with the resolution of the sampling period of the ADC 20 by means of a cross-correlation function between the digital data of the output signal and the digital data of the input signal. In other words, the arithmetic section 40 may compute a phase at which the cross-correlation function takes a peak value as the phase difference between the input signal and the output signal in the resolution of the sampling period of the ADC 20.

Figure 6:
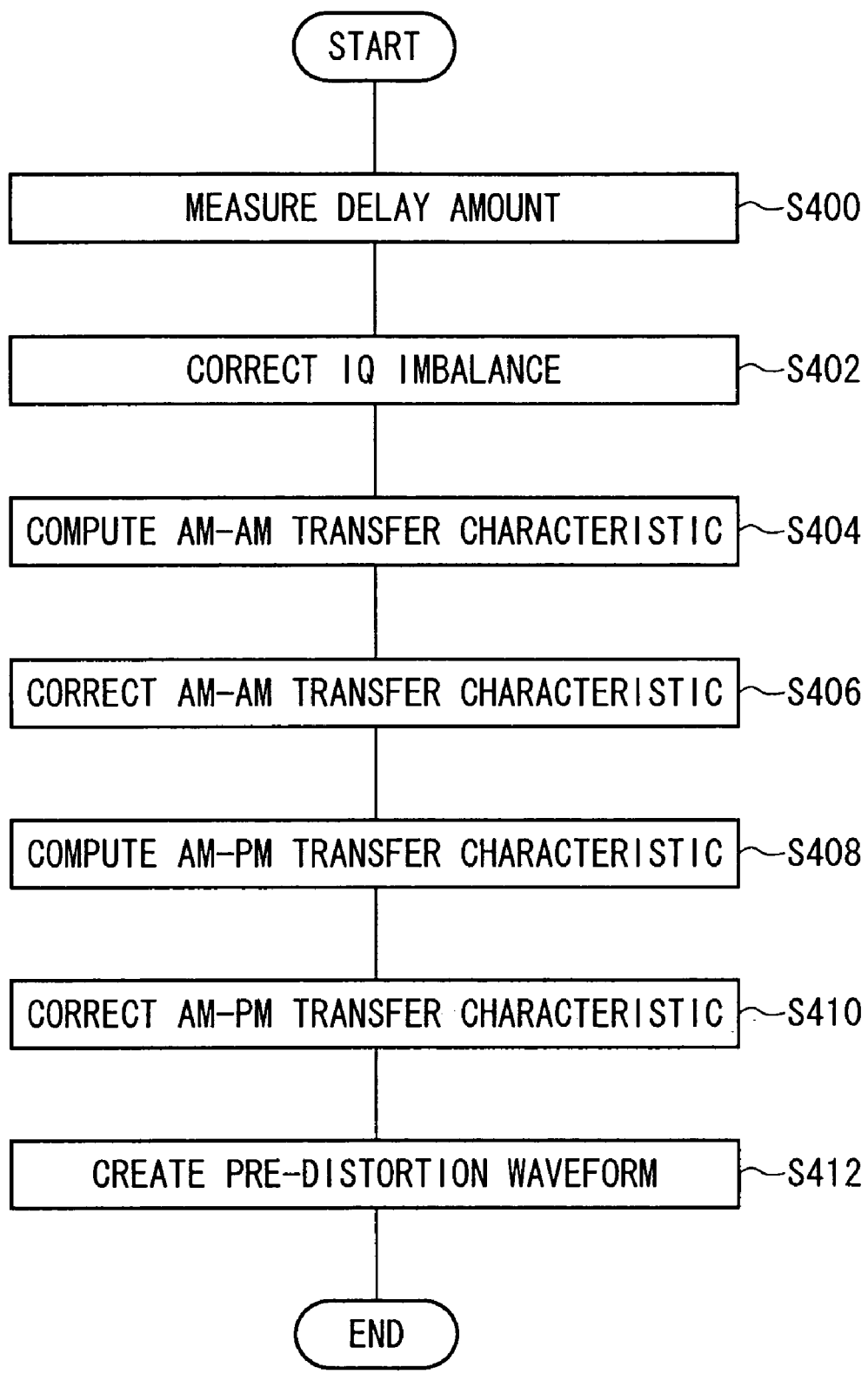
FIG. 6 is a flowchart exemplary showing a nonlinear characteristic computing method of computing a nonlinear characteristic of the electronic device 200.

FIG. 6 is a flowchart exemplary showing a nonlinear characteristic computing method of computing a nonlinear characteristic of the electronic device 200. In the nonlinear characteristic computing method in this example, a nonlinear characteristic of the electronic device 200 is computed, and a pre-distortion waveform to correct a distortion of the output signal by the nonlinear characteristic is generated. The pre-distortion waveform is a waveform to previously provide a distortion according to a nonlinear characteristic of the electronic device 200 to an input signal to be input into the electronic device 200 such as an amplifier. In other words, it is possible to offset a distortion by a nonlinear characteristic of the electronic device 200 by superimposing a pre-distortion waveform on the input signal.

At first, a delay amount in the electronic device 200 is measured (S400). In S400, a delay amount is measured by the delay amount measuring method described in reference to FIG. 2 or 5. Further, in S400, based on the computed delay amount, the phase of output signal or input signal is shifted, and the influence of the delay amount in the electronic device 200 is canceled.

Next, imbalance of a quadrature component of an I component and a Q component is corrected based on the input signal data and the output signal data in which the influence of the delay amount in the electronic device 200 is cancelled (S402). Then, an AM-AM transfer characteristic in the electronic device 200 is computed based on the input signal data and the output signal data corrected in S402 (S404). The AM-AM transfer characteristic is a characteristic of a gain in the electronic device 200 varying with a level of the input signal. The AM-AM transfer characteristic computed in S404 is stored on the arithmetic section 40. Then, the AM-AM transfer characteristic is corrected (S406).

Next, an AM-PM transfer characteristic of the electronic device 200 is computed based on the corrected input signal data and output signal data (S408). The AM-PM transfer characteristic is a characteristic of the phase of the output signal varying with a level of the input signal. The AM-PM transfer characteristic computed in S406 is stored on the arithmetic section 40. Then, the AM-PM transfer characteristic is corrected (S410). Then, a pre-distortion waveform is generated based on the AM-AM transfer characteristic and the AM-PM transfer characteristic stored on the arithmetic section 40 (S412).

According to a nonlinear characteristic computing method in this example, since the influence by a delay amount in the electronic device 200 can be corrected with high precision, it is possible to compute a nonlinear characteristic of the electronic device 200 with high precision.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, although an output signal has a distortion due to nonlinearity of an electronic device, it is possible to compute a delay amount in the electronic device with high precision without relying on a waveform of the output signal.

What is claimed is:

1. A delay amount measuring method of measuring a delay amount in a nonlinear analogue electronic device that outputs an output signal according to an input signal, comprising:

a conversion step of converting the input signal and the output signal into digital data;

a shift step of sequentially shifting the digital data of either of the input signal or the output signal in a time direction;

an error computing step of computing a squared error of the digital data of the input signal and the digital data of the output signal with respect to each shift amount in said shift step;

a delay amount computing step of computing the shift amount when the squared error is a minimum value by means of a nonlinear least squares method and using the computed shift amount as the delay amount in the nonlinear analogue electronic device; and outputting the computed shift amount for use as the delay amount in the nonlinear analogue electronic device.

2. The delay amount measuring method of claim 1, further comprising:

shifting a phase of at least one of the output signal or the input signal;

canceling an influence of the delay amount in the electronic device from the output signal and the input signal;

correcting an imbalance of a quadrature component of an I component and a Q component of the output signal and the input signal;

computing an AM-AM transfer characteristic in the electronic device based on the corrected input signal and the corrected output signal;

computing an AM-PM transfer characteristic in the electronic device based on the corrected input signal and the corrected output signal;

generating a pre-distortion waveform based on the computed AM-AM transfer characteristic and the computed AM-PM transfer characteristic.

3. A delay amount measuring apparatus for measuring a delay amount in a nonlinear analogue electronic device, the delay amount measuring apparatus comprising:

a signal generator that generates an input signal, wherein the nonlinear analogue electronic device outputs an output signal according to the input signal;

a converter capable of converting signals into digital data, wherein the converter converts the input signal into input digital data and the output signal into output digital data; and an arithmetic section for performing steps comprising:
a shift step of sequentially shifting either the input digital data or the output digital data in a time direction;
an error computing step of computing a squared error of the input digital data and the output digital data with respect to each shift amount in said shift step; and
a delay amount computing step of computing the shift amount when the squared error is a minimum value by means of a nonlinear least squares method, wherein the arithmetic section outputs the computed shift amount for use as the delay amount in the nonlinear analogue electronic device.

4. The delay amount measuring apparatus for measuring a delay amount in a nonlinear analogue electronic device of claim 3, wherein the arithmetic section for performing steps further comprising:

shifting a phase either of the output signal or the input signal;

canceling an influence of the delay amount in the electronic device from the output signal and the input signal;

correcting an imbalance of a quadrature component of an I component and a Q component of the output signal and the input signal;

computing an AM-AM transfer characteristic in the electronic device based on the corrected input signal and the corrected output signal;

computing an AM-PM transfer characteristic in the electronic device based on the corrected input signal and the corrected output signal;

generating a pre-distortion waveform based on the computed AM-AM transfer characteristic and the computed AM-PM transfer characteristic.

* * * * *